United States Patent
Kawamura

(10) Patent No.: US 7,209,188 B2
(45) Date of Patent: Apr. 24, 2007

(54) INTERMEDIATE-FREQUENCY CIRCUIT HAVING FLAT GROUP DELAY CHARACTERISTIC

(75) Inventor: Akira Kawamura, Miygai-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 415 days.

(21) Appl. No.: 10/833,421

(22) Filed: Apr. 27, 2004

(65) Prior Publication Data

US 2004/0223087 A1 Nov. 11, 2004

(30) Foreign Application Priority Data

May 8, 2003 (JP) ............... 2003-002575 U

(51) Int. Cl.
*H04N 5/50* (2006.01)
(52) U.S. Cl. ............... 348/731; 455/197.2
(58) Field of Classification Search ............... 348/731, 348/725, 726, 729; 455/311, 188.1, 197.2, 455/340, 197.3; 333/174–176
See application file for complete search history.

(56) References Cited

U.S. PATENT DOCUMENTS

| 3,590,143 | A | * | 6/1971 | Narita et al. ............... 348/647 |
| 4,263,619 | A | * | 4/1981 | Theriault ............... 348/736 |
| 4,795,990 | A | * | 1/1989 | Ishikawa et al. ............... 333/176 |
| 6,342,928 | B1 | * | 1/2002 | Ohira ............... 348/729 |
| 6,795,128 | B2 | * | 9/2004 | Yamamoto ............... 348/729 |
| 6,876,402 | B2 | * | 4/2005 | Sasaki ............... 348/731 |
| 7,030,937 | B2 | * | 4/2006 | Yamamoto ............... 348/729 |

FOREIGN PATENT DOCUMENTS

JP 2002-281401 9/2002

* cited by examiner

*Primary Examiner*—Paulos Natnael
(74) *Attorney, Agent, or Firm*—Brinks Hofer Gilson & Lione

(57) ABSTRACT

An intermediate-frequency circuit includes a mixer for converting a received TV signal to an intermediate-frequency signal; an intermediate-frequency amplifier for amplifying the intermediate-frequency signal; an intermediate-frequency tuning circuit for tuning to the intermediate-frequency signal, the intermediate-frequency tuning circuit being interposed between the mixer and the intermediate-frequency amplifier; and a trap circuit interposed between the mixer and the intermediate-frequency tuning circuit or between the intermediate-frequency tuning circuit and the intermediate-frequency amplifier, wherein a trap frequency of the trap circuit can be changed in a region outside a video intermediate frequency.

2 Claims, 3 Drawing Sheets

INTERMEDIATE-FREQUENCY CIRCUIT HAVING FLAT GROUP DELAY CHARACTERISTIC

This application claims the benefit of priority to Japanese Patent Application No. 2003-002575, herein incorporated by reference.

BACKGROUND OF THE INVENTION

1. Field of the Invention

The present invention relates to intermediate-frequency circuits for television (TV) tuners.

2. Description of the Related Art

FIG. 4 shows a known intermediate-frequency circuit. First, a selected TV signal (RF) and a local oscillator signal (LO) are fed to a mixer 31. The resulting intermediate-frequency signal from the mixer 31 is then fed through an intermediate-frequency tuning circuit 32 to an intermediate-frequency amplifier 33. The intermediate-frequency tuning circuit 32 is a parallel-connected tuned circuit in which series-connected inductance elements 32a and 32b and a capacitive element 32c are connected in parallel. A voltage B for feeding to the mixer 31 is applied to a junction between the two inductance elements 32a and 32b. The mixer 31 and the intermediate-frequency amplifier 33 form a balanced circuit. The intermediate-frequency tuning circuit 32 is connected to two balanced lines connecting the output terminal and the input terminal of the mixer 31 and the intermediate-frequency amplifier 33, respectively.

An intermediate-frequency signal from the intermediate-frequency amplifier 33 is fed through a surface-acoustic-wave (SAW) filter 34 to a video detector 35, while a local oscillator signal for synchronous detection is fed from a voltage-controlled oscillator (not shown) to the video detector 35. A video signal is then transmitted from the video detector 35.

In the National Television System Committee (NTSC) mode, over the frequency range from 0 (direct current) to about 4 MHz, a video signal is required to exhibit a flat characteristic as well as constant group delay time, which is substantially determined by a video detector and a SAW filter. Specifically, the group delay time in the frequency band ranging from 60 Hz to 1 MHz may be shortened by about 50 to 100 ns as compared to that in the frequency band ranging from 2 to 3 MHz. In this case, the group delay time in the lower band (60 Hz to 1 MHz), which leads to overshoot and undershoot of the video signal, cannot be easily corrected (see FIG. 5).

SUMMARY OF THE INVENTION

Accordingly, an object of the present invention to provide an intermediate-frequency circuit that can achieve, with a simple structure, a flat group delay characteristic in a video frequency band by increasing the group delay time at a video intermediate frequency and in the vicinity thereof.

To solve the above-described problem, an intermediate-frequency circuit according to the present invention includes a mixer for converting a received TV signal to an intermediate-frequency signal; an intermediate-frequency amplifier for amplifying the intermediate-frequency signal; an intermediate-frequency tuning circuit for tuning to the intermediate-frequency signal, the intermediate-frequency tuning circuit being interposed between the mixer and the intermediate-frequency amplifier; and a trap circuit interposed between the mixer and the intermediate-frequency tuning circuit or between the intermediate-frequency tuning circuit and the intermediate-frequency amplifier, wherein a trap frequency of the trap circuit can be changed in a region outside a video intermediate frequency.

Accordingly, the phase of a video signal at the video intermediate frequency and in the vicinity thereof is changed, the group delay time increases, and a flat group delay characteristic in a video frequency band can thus be achieved.

Further, the trap frequency lies 0.5 to 1.5 MHz outside a sound intermediate frequency of a neighboring channel.

A flat group delay characteristic can thus be achieved without significantly affecting the response of a video intermediate-frequency signal.

Moreover, the trap circuit is composed of an inductance element and a resistive element that are connected in series and a variable capacitive element connected in parallel to the series-connected inductance element and resistive element. The resistive element is a variable resistor.

Thus, the group delay characteristic can be easily adjusted since the trap frequency and attenuation at this frequency level can be changed.

DESCRIPTION OF THE PREFERRED EMBODIMENTS

Figure 1:
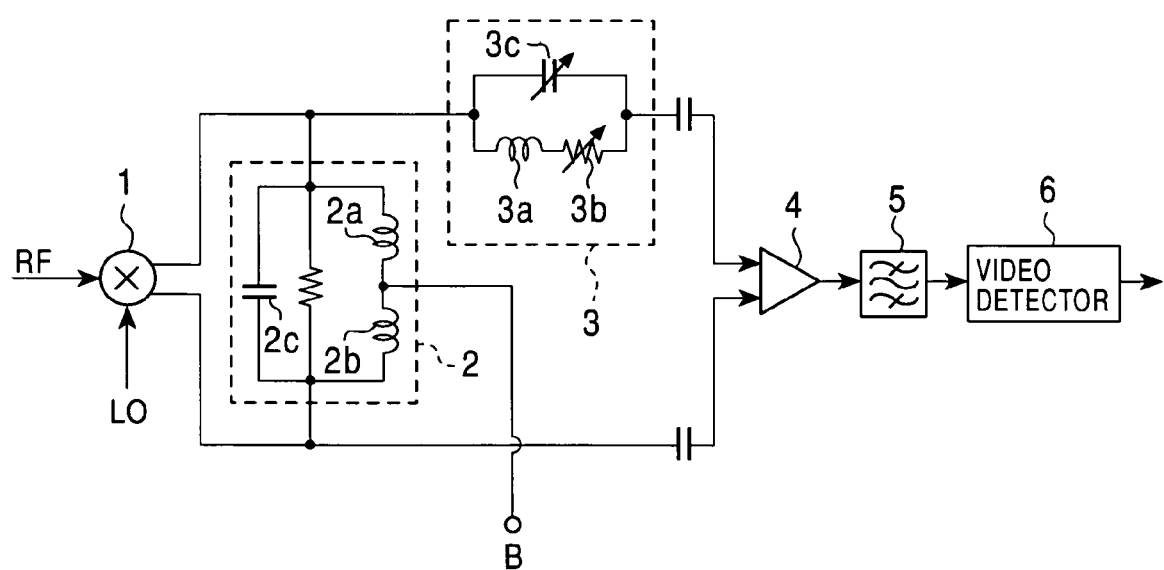
FIG. 1 is a circuit diagram of an intermediate-frequency circuit according to the present invention.

FIG. 1 shows an intermediate-frequency circuit according to the present invention. A selected TV signal (RF) and a local oscillator signal (LO) are fed to a mixer 1. The resulting intermediate-frequency signal from the mixer 1 is then fed through an intermediate-frequency tuning circuit 2 and a trap circuit 3 to an intermediate-frequency amplifier 4. The intermediate-frequency tuning circuit 2 is a parallel-connected tuned circuit in which two series-connected inductance elements 2a and 2b and a capacitive element 2c are connected in parallel. The mixer 1 is formed of a balanced circuit, and the intermediate-frequency tuning circuit 2 is connected to balanced output terminals of the mixer 1. A voltage B for feeding to the mixer 1 is applied to a junction between the two inductance elements 2a and 2b. The intermediate-frequency amplifier 4 is also formed of a balanced circuit. The trap circuit 3 is connected to both one input terminal of the intermediate-frequency amplifier 4 and one terminal of the intermediate-frequency tuning circuit 2, while the other input terminal of the intermediate-frequency amplifier 4 is connected to the other terminal of the intermediate-frequency tuning circuit 2.

The trap circuit 3 is composed of an inductance element 3a and a resistive element 3b that are connected in series, and a variable capacitive element 3c connected in parallel to the series-connected inductance element 3a and resistive element 3b. The resistive element 3b is a variable resistor, while the variable capacitive element 3c is, for example, a varactor diode.

Figure 2:
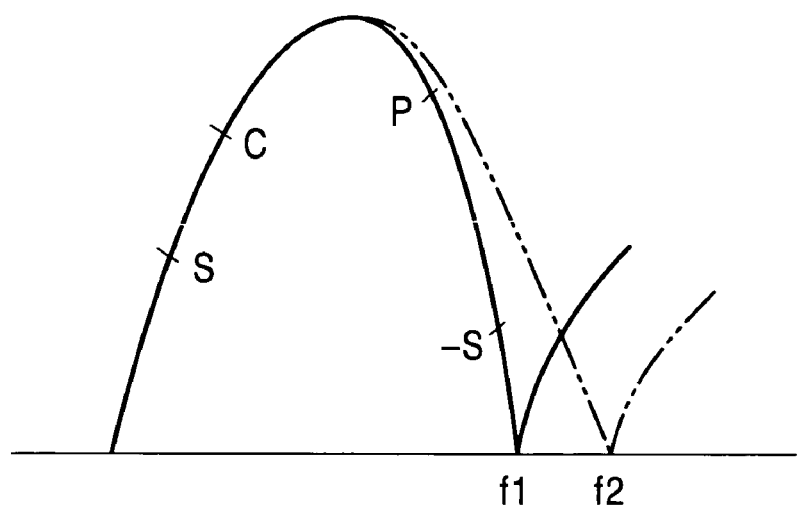
FIG. 2 is a characteristic diagram of the intermediate-frequency circuit according to the present invention.

As shown in FIG. 2, a frequency response at the input terminal of the intermediate-frequency amplifier 4 is tuned between a video intermediate frequency (P) and a color-subcarrier frequency (C), and is attenuated in a region which is 0.5 MHz (f1) to 1.5 MHz (f2) higher than a neighboring sound intermediate frequency (−S). The attenuation frequency range from f1 to f2 depends on the variable capacitive element 3c, while the level of attenuation depends on the resistive element 3b.

An intermediate-frequency signal from the intermediate-frequency amplifier 4 is fed through a SAW filter 5 to a video detector 6. Also, a local oscillator signal for synchronous detection is fed from a voltage-controlled oscillator (not shown) to the video detector 6. Then, a video signal is transmitted from the video detector 6.

Figure 3:
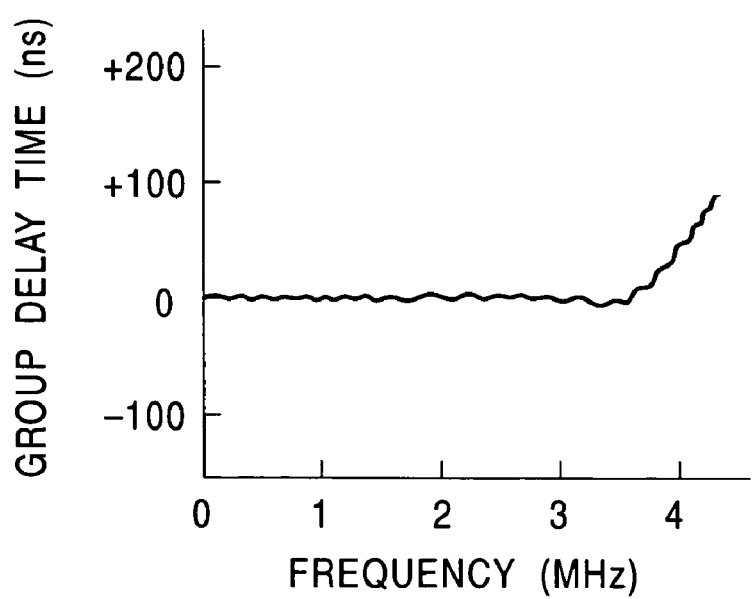
FIG. 3 shows a group delay characteristic of a video signal in the intermediate-frequency circuit according to the present invention.
Figure 4:
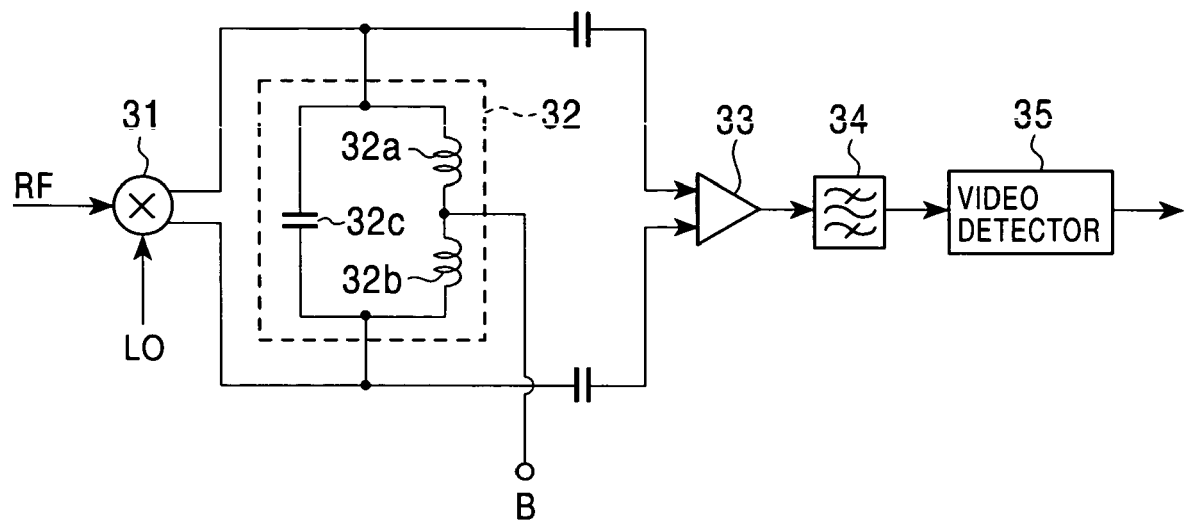
FIG. 4 is a circuit diagram of a known intermediate-frequency circuit.
Figure 5:
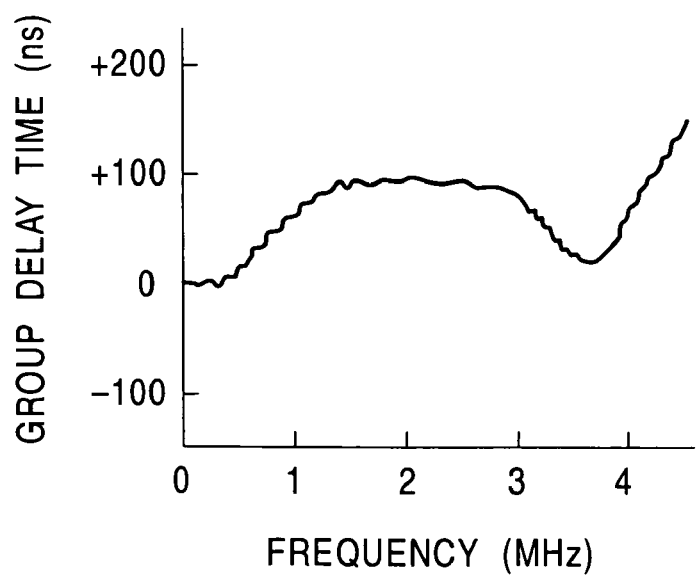
FIG. 5 shows a group delay characteristic of a video signal in the known intermediate-frequency circuit.

In the intermediate-frequency circuit described above, the trap circuit 3 changes the response at the video intermediate frequency (P) and in the vicinity thereof. This brings about changes (delays) in phase, and thus increases the group delay time. Since a detection time increases at the video intermediate frequency (P) and in the vicinity thereof, an apparent flat delay-time (with reference to the delay time at a frequency of 0) can be achieved by adjusting the trap frequency with the variable capacitive element 3c and/or by adjusting the level of attenuation with the resistive element 3b (see FIG. 3).

The trap frequency f1 lower than the neighboring sound intermediate frequency (−S), that is, adjacent to the video intermediate frequency (P), is not preferable since attenuation of the video intermediate-frequency signal increases. Further, the group delay time cannot be effectively adjusted if the trap frequency f2 is higher than the neighboring sound intermediate frequency (−S) by more than 1.5 MHz.

In the present embodiment, the trap circuit 3 is interposed between the intermediate-frequency tuning circuit 2 and the intermediate-frequency amplifier 4. However, it may be interposed between the mixer 1 and the intermediate-frequency tuning circuit 2.

What is claimed is:

1. An intermediate-frequency circuit comprising:
   a mixer for converting a received TV signal to an intermediate-frequency signal;
   an intermediate-frequency amplifier for amplifying the intermediate-frequency signal;
   an intermediate-frequency tuning circuit for tuning to the intermediate-frequency signal, the intermediate-frequency tuning circuit being interposed between the mixer and the intermediate-frequency amplifier;
   a trap circuit interposed between the mixer and the intermediate-frequency tuning circuit or between the intermediate-frequency tuning circuit and the intermediate-frequency amplifier, wherein a trap frequency of the trap circuit can be changed in a region outside a video intermediate frequency;
   a resistive element being a variable resistor;
   an inductance element connected in series to the resistive element; and
   a variable capacitive element connected in parallel to the series-connected resistive element and inductance element.

2. The intermediate-frequency circuit according to claim 1, wherein the trap frequency lies 0.5 to 1.5 MHz outside a sound intermediate frequency of a neighboring channel.

\* \* \* \* \*